United States Patent
Hsu

(10) Patent No.: US 8,299,814 B2
(45) Date of Patent: Oct. 30, 2012

(54) PDU TESTING APPARATUS

(75) Inventor: Ming-Yuan Hsu, Tu-Cheng (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 291 days.

(21) Appl. No.: 12/888,610

(22) Filed: Sep. 23, 2010

(65) Prior Publication Data

US 2012/0062273 A1 Mar. 15, 2012

(30) Foreign Application Priority Data

Sep. 13, 2010 (TW) ................................ 99130895 A

(51) Int. Cl.
*G01R 31/40* (2006.01)
(52) U.S. Cl. ................... 324/764.01; 324/512; 324/522; 324/525
(58) Field of Classification Search .................. None
See application file for complete search history.

(56) References Cited

U.S. PATENT DOCUMENTS

| | | | | |
|---|---|---|---|---|
| 3,323,060 A | * | 5/1967 | Bereskin | 324/762.08 |
| 3,443,215 A | * | 5/1969 | Bradley | 324/706 |
| 3,973,135 A | * | 8/1976 | Scott | 307/141 |
| 7,687,933 B2 | * | 3/2010 | Rennie | 307/9.1 |
| 8,159,258 B2 | * | 4/2012 | Xie | 324/764.01 |

* cited by examiner

*Primary Examiner* — Hezron E Williams
*Assistant Examiner* — Hoang Nguyen
(74) *Attorney, Agent, or Firm* — Altis Law Group, Inc.

(57) ABSTRACT

A power distribution unit (PDU) testing apparatus includes a main power plug, a number of branch power plugs, a main switch, a number of branch switches, and a number of loads. The main switch and the branch switches are single-pole double-throw switches. A first terminal of the main power plug is connected to the first throw of the main switch. The second throw of the main switch is idle. The pole of the main switch is connected to the second throws of the branch switches. The first throws of the branch switches are respectively connected to first terminals of the branch power plugs. Second terminals of the branch power plugs are connected a second terminal of the main power plug. The poles of the branch switches are respectively connected to first terminals of the loads. Second terminals of the loads are connected to the second terminal of the main power plug.

2 Claims, 2 Drawing Sheets

PDU TESTING APPARATUS

BACKGROUND

1. Technical Field

The present disclosure relates to a power distribution unit (PDU) testing apparatus.

2. Description of Related Art

PDUs are devices that distribute electric power, and are widely used in servers. Before shipment, the PDUs should be tested. A common method used to test PDUs requires the use of one or more servers. However, the servers are expensive and not easy to use.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
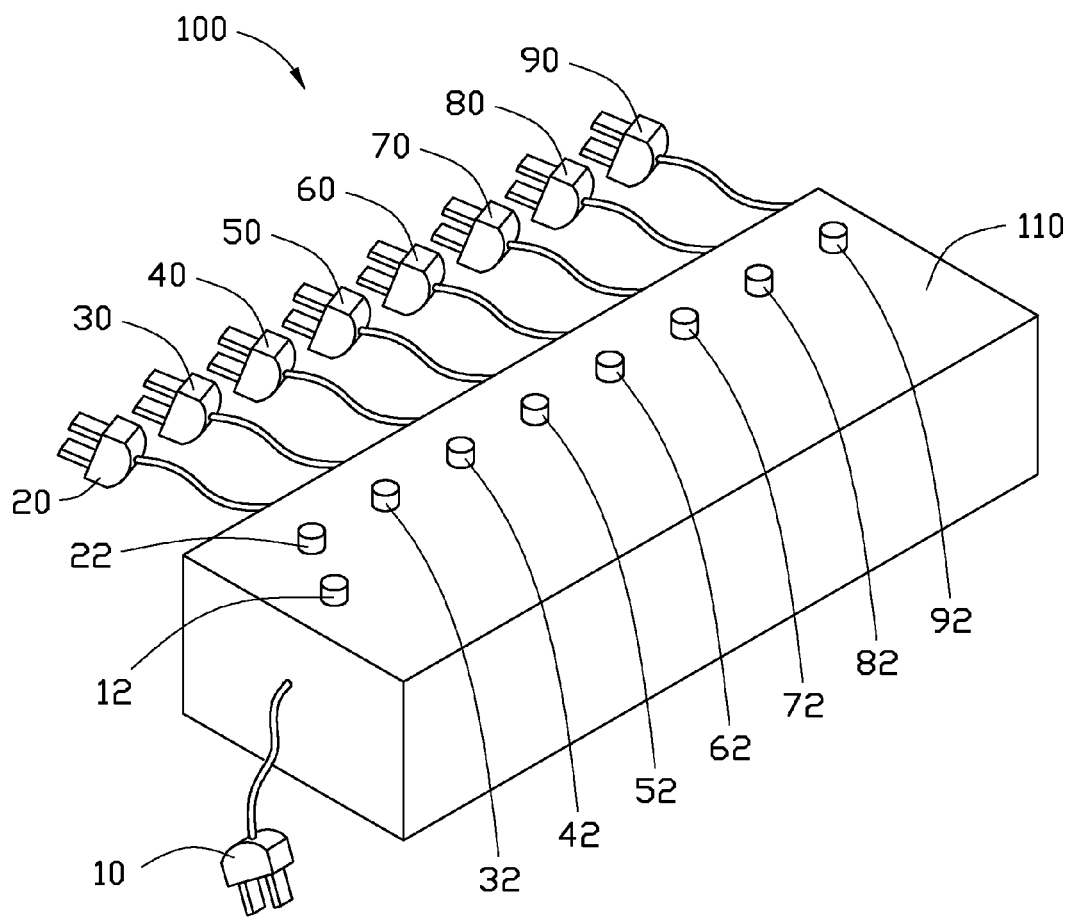
FIG. 1 is a schematic, isometric view of an embodiment of a power distribution unit (PDU) testing apparatus.
Figure 2:
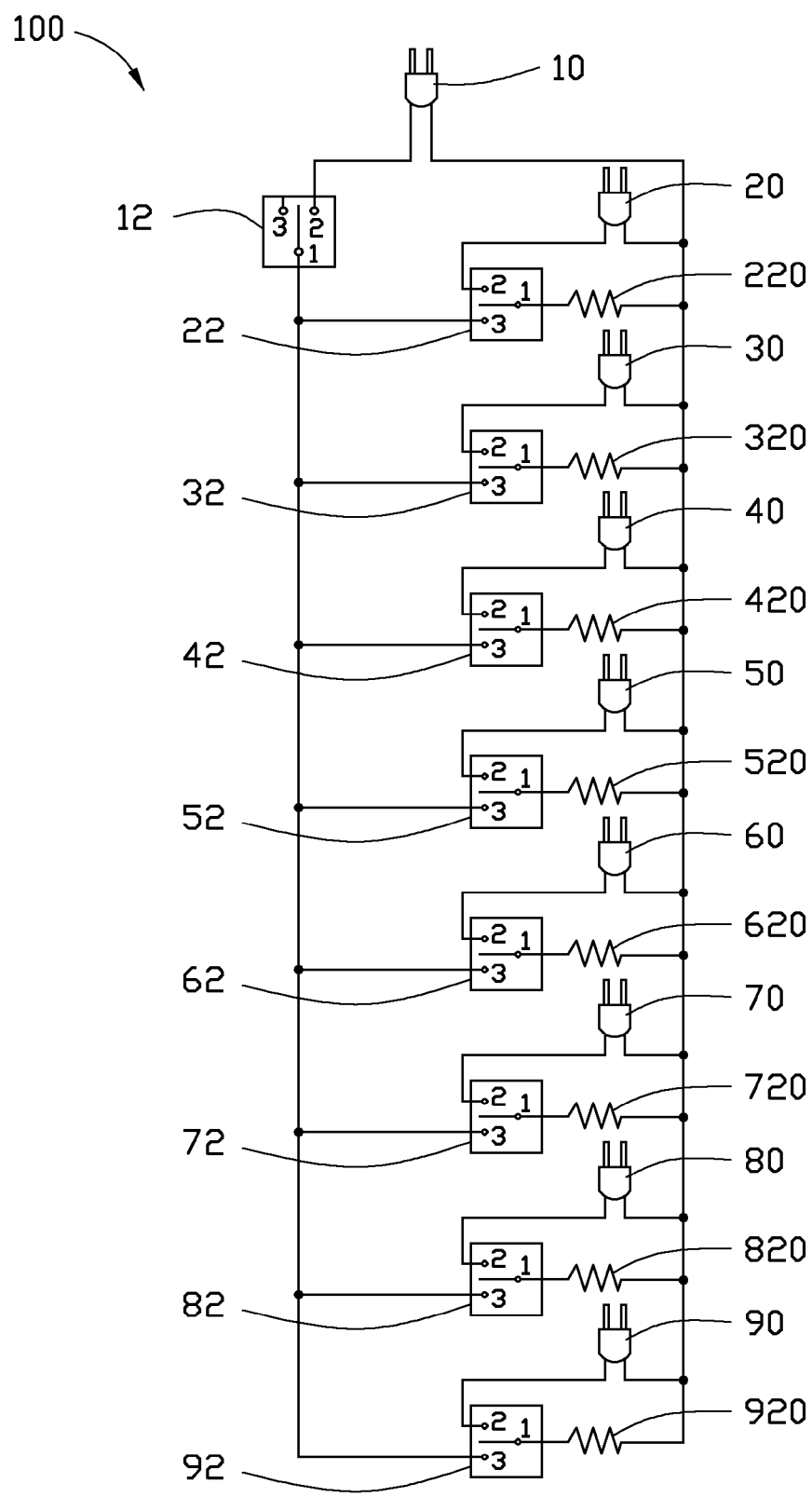
FIG. 2 is a circuit diagram of the PDU testing apparatus of FIG. 1.

Referring to FIGS. 1 and 2, an embodiment of a power distribution unit (PDU) testing apparatus 100 includes a case 110, a main power plug 10, a number of branch power plugs 20-90, a main switch 12 corresponding to the main power plug 10, a number of branch switches 22-92 respectively corresponding to the branch power plugs 20-90, and a number of loads 220-920. There is an equal number of the loads 220-920, the branch power plugs 20-90, and the branch switches 22-92, which can be adjusted according to requirements. In one embodiment, the resistances of the loads 220-920 are the same.

The main power plug 10, the branch power plugs 20-90, the main switch 12, and the branch switches 22-92 are arranged on the case 110, and the loads 220-920 are arranged in the case 110. In one embodiment, the main switch 12 and the branch switches 22-92 are single-pole double-throw (SPDT) switches each including a pole 1 and two throws 2, 3. The pole 1 is changed from being electrically connected to one throw to the other throw when the corresponding SPDT switch is pressed.

A first terminal of the main power plug 10 is connected to the throw 2 of the main switch 12. The throw 3 of the main switch 12 is idle. The pole 1 of the main switch 12 is connected to the throws 3 of the branch switches 22-92. The throws 2 of the branch switches 22-92 are respectively connected to first terminals of the branch power plugs 20-90. Second terminals of the branch power plugs 20-90 are connected to a second terminal of the main power plug 10. The poles 1 of the branch switches 22-92 are respectively connected to first terminals of the loads 220-920. Second terminal of the loads 220-920 are connected to the second terminal of the main power plug 10.

In use, a PDU (not shown) is tested by the PDU testing apparatus 100. There are two tests performed on the PDU which includes a number of power outlets. In a first test, the poles 1 of the branch switches 22-92 are electrically connected to the corresponding throws 2. The branch power plugs 20-90 are respectively connected to the power outlets of the PDU. Therefore, the loads 220-920 are respectively connected to the power outlets of the PDU, to test the PDU in the first test part.

In a second test, the poles 1 of the branch switches 22-92 are electrically connected to the corresponding throws 3, and the pole 1 of the main switch 12 is electrically connected to the corresponding throw 2. The main power plug 10 is connected to the power outlets of the PDU. Therefore, the loads 220-920 are together connected to all of the power outlets of the PDU, to test the PDU in the second test part.

The PDU testing apparatus 100 can perform different tests on the PDU without the need of a server, which is very convenient and cost efficient.

It is to be understood, however, that even though numerous characteristics and advantages of the embodiments have been set forth in the foregoing description, together with details of the structure and function of the embodiments, the disclosure is illustrative only, and changes may be made in details, especially in matters of shape, size, and arrangement of parts within the principles of the embodiments to the full extent indicated by the broad general meaning of the terms in which the appended claims are expressed.

What is claimed is:

1. A power distribution unit (PDU) testing apparatus comprising:
    a main power plug and a plurality of branch power plugs;
    a main switch and a plurality of branch switches which are single-pole double-throw switches each comprising a pole, a first throw, and a second throw; and
    a plurality of loads;
    wherein a first terminal of the main power plug is connected to the first throw of the main switch, the second throw of the main switch is idle, the pole of the main switch is connected to the second throws of the plurality of branch switches, the first throws of the plurality of branch switches are respectively connected to first terminals of the plurality of branch power plugs, second terminals of the plurality of branch power plugs are connected to a second terminal of the main power plug, the poles of the plurality of branch switches are respectively connected to first terminals of the plurality of loads, second terminal of the plurality of loads are connected to the second terminal of the main power plug.

2. The PDU testing apparatus of claim 1, wherein the resistances of the plurality of loads are the same.

* * * * *